United States Patent
Tsai et al.

(10) Patent No.: US 6,384,626 B2
(45) Date of Patent: May 7, 2002

(54) PROGRAMMABLE APPARATUS AND METHOD FOR PROGRAMMING A PROGRAMMABLE DEVICE

(75) Inventors: Jerry Tsai; Alex Jeng, both of Taipei Hsien (TW)

(73) Assignee: Micro-Star Int'l Co., Ltd., Taipei (TW)

( * ) Notice: Subject to any disclaimer, the term of this patent is extended or adjusted under 35 U.S.C. 154(b) by 0 days.

(21) Appl. No.: 09/836,343

(22) Filed: Apr. 18, 2001

(30) Foreign Application Priority Data

Jul. 19, 2000 (TW) .......................................... 089114459

(51) Int. Cl.[7] ........................................... H03K 19/177
(52) U.S. Cl. ........................... 326/38; 326/37; 713/300; 713/310
(58) Field of Search ...................... 326/38–41; 713/300, 713/310

(56) References Cited

U.S. PATENT DOCUMENTS 5,650,734 A * 7/1997 Chu et al. .................... 326/38
6,191,608 B1 * 2/2001 Cliff et al. ..................... 326/38
6,233,464 B1 * 5/2001 Chmaytelli ................. 455/556

* cited by examiner

Primary Examiner—Michael Tokar
Assistant Examiner—Vibol Tan
(74) Attorney, Agent, or Firm—Finnegan, Henderson, Farabow, Garrett & Dunner, L.L.P.

(57) ABSTRACT

A programmable apparatus includes a circuit board having a first node coupled electrically to an input power port, and a second node coupled electrically and selectively to a programming device, a programmable device mounted on the circuit board and having an input power terminal coupled electrically to the second node, and a switch mounted on the circuit board and interconnecting the first and second nodes. The switch is operable between a closed state, wherein the programmable device receives input power via the input power port, and an opened state, wherein the programmable device is disconnected from the input power port such that the programming device can be coupled to the second node for supplying input power to the input power terminal when programming the programmable device. A method for programming a programmable device is also disclosed.

3 Claims, 1 Drawing Sheet

PROGRAMMABLE APPARATUS AND METHOD FOR PROGRAMMING A PROGRAMMABLE DEVICE

BACKGROUND OF THE INVENTION

1. Field of the Invention

The invention relates to a programmable apparatus and method for programming a programmable device, more particularly to a programmable apparatus and method for programming a programmable device, wherein a programming device supplies input power to the programmable device during programming of the latter.

2. Description of the Related Art

Generally, a circuit board is provided with a plurality of programmable devices, such as electrically erasable programmable read only memories (EEPROM), field programmable gate arrays (FPGA), programmable logic arrays (PLA), flash memories, etc., for storing specific data or executing specific function. Prior to assembling the programmable devices to the circuit board, a programming device programs the programmable devices so as to store specific data therein.

For example, the programming device can be used to program BIOS data to a flash memory. Then, the flash memory is assembled to a circuit board. When the BIOS data stored in the flash memory needs to be rewritten after assembly of the flash memory on the circuit board, there are first and second ways available to rewrite the BIOS data:

1. The flash memory can be detached from the circuit board. Then, a programming device is utilized to program the flash device.
2. When the flash memory cannot be detached from the circuit board, a computer can be utilized to rewrite BIOS data to the flash memory.

However, in the first way, to facilitate detachment of the flash memory from the circuit board, a socket, which is mounted on the circuit board, is necessary for the flash memory, thereby resulting in increased costs. Furthermore, in the second way, the circuit board needs to be implemented with a plurality of computer components, such as a CPU and a display card, and to be coupled electrically to a plurality of peripheral components, such as a hard disk and a power supply. Only then can the computer be set up so as to program the flash memory. It takes a lot of time to set up the computer, thereby resulting in a relatively long programming time and relatively high costs.

SUMMARY OF THE INVENTION

Therefore, the object of the present invention is to provide a programmable apparatus and method for programming a programmable device, wherein a programming device supplies input power to the programmable device during programming of the latter.

According to one aspect of the present invention, a programmable apparatus is adapted to be programmed by a programming device, and comprises:

a circuit board having first and second nodes, and an input power port coupled electrically to the first node for receiving input power, the second node being adapted to be coupled electrically and selectively to the programming device;

a programmable device mounted on the circuit board and having an input power terminal coupled electrically to the second node;

an electronic component unit mounted on the circuit board and coupled electrically to the first node; and a switch mounted on the circuit board and interconnecting the first and second nodes, the switch being operable between a closed state, wherein the programmable device and the electronic component unit receive the input power via the input power port, and an opened state, wherein the programmable device is disconnected from the input power port such that the programming device can be coupled to the second node for supplying input power to the input power terminal when programming the programmable device.

According to another aspect of the present invention, a method is adapted for programming a programmable device mounted on a circuit board and having an input power terminal. The circuit board has a first node, a second node coupled electrically to the input power terminal, a switch for connecting the first and second nodes, and an input power port coupled electrically to the first node for receiving input power. The method comprises the steps of:

allowing the switch to disconnect the connection between the first and second nodes such that the programmable device is disconnected from the input power port when programming the programmable device; and providing a programming device that is coupled to the second node for supplying input power to the input power terminal when programming the programmable device.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
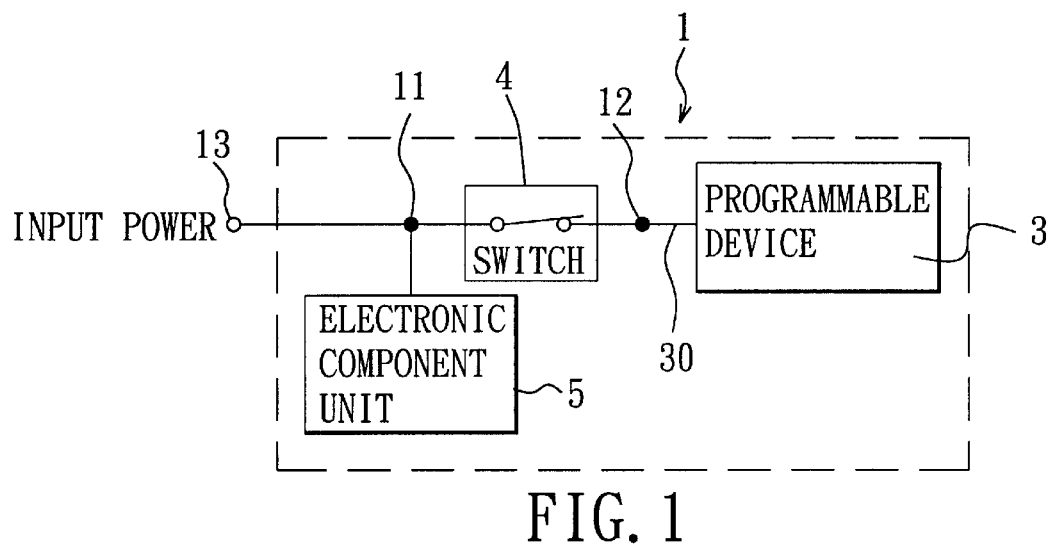
FIG. 1 is a schematic circuit block diagram illustrating the preferred embodiment of a programmable apparatus according to this invention when a switch thereof is in a closed state.
Figure 2:
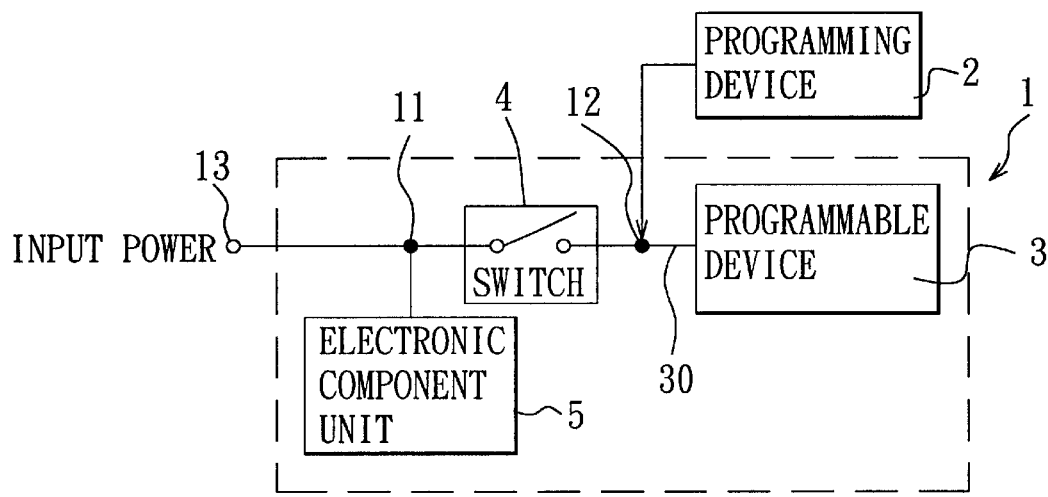
FIG. 2 is a schematic circuit block diagram illustrating the preferred embodiment when the switch is in an opened state.

Referring to FIGS. 1 and 2, according to the preferred embodiment of this invention, a programmable apparatus is adapted to be programmed by a programming device 2, and is shown to include a circuit board 1, a programmable device 3, an electronic component unit 5, and a switch 4.

The circuit board 1 has first and second nodes 11, 12, and an input power port 13 coupled electrically to the first node 11 for receiving input power form a power supply (not shown). The second node 12 is adapted to be coupled electrically and selectively to the programming device 2.

The programmable device 3, such as a flash memory for storing BIOS data, is mounted on the circuit board 1, and has an input power terminal 30 coupled electrically to the second node 12. It is noted that the programmable device 3 can also be an electrically erasable programmable read only memory (EEPROM), a field programmable gate array (FPGA), or a programmable logic array (PLA).

The electronic component unit 5 is mounted on the circuit board 1, and is coupled electrically to the first node 11.

Figure 3:
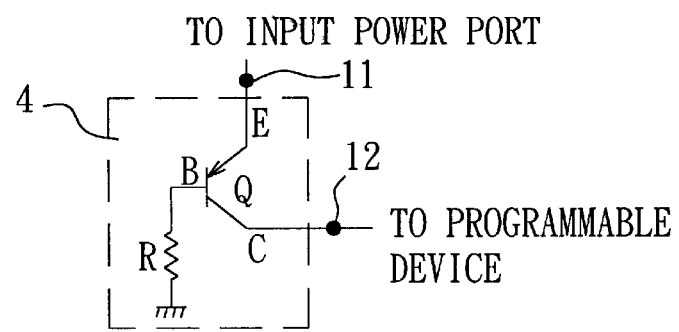
FIG. 3 is a schematic electrical circuit diagram of the switch.

The switch 4 is mounted on the circuit board 1, and interconnects the first and second nodes 11, 12. The switch 4 is operable between a closed state, wherein the programmable device 3 and the electronic component unit 5 receive the input power via the input power port 13, as shown in FIG. 1, and an opened state, wherein the programmable device 3 is disconnected from the input power port 13 such that the programming device 2 can be coupled to the second node 12 for supplying input power to the input power terminal 30 and will not interfere with the electronic component unit 5 when programming the programmable device 3, as shown in FIG. 2. The data and address pins (not shown) of the programmable device 3 are connected directly to the programming device 2 via contact probes (not shown) on the latter. Referring to FIG. 3, in this embodiment, the switch 4 is a transistor switch that includes a PNP transistor (Q). The transistor (Q) has an emitter (E) connected to the first node 11, a collector (C) connected to the second node 12, and a base (B) connected to ground via a resistor (R). As such, when the emitter (E) receives the input power via the input power port 13, the transistor (Q) is turned on such that the programmable device 3 receives the input power. Otherwise, the transistor (Q) is turned off such that the programmable device 3 is disconnected from the input power port 13.

Since the programmable device 3 does not have to be detached from the circuit board 1 when programming the programmable device 3, the socket used in the aforesaid first way according to the prior art can be omitted, thereby resulting in reduced costs. Furthermore, since the programmable apparatus of this invention utilizes the programming device 2 to supplying input power when programming the programmable device 3, as compared to the aforesaid first and second ways of the prior art, the time spent in detachment from the socket or set up of a computer can be saved, thereby resulting in a shorter programming time.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A programmable apparatus adapted to be programmed by a programming device, comprising:

a circuit board having first and second nodes, and an input power port coupled electrically to said first node for receiving input power, said second node being adapted to be coupled electrically and selectively to the programming device;

a programmable device mounted on said circuit board and having an input power terminal coupled electrically to said second node;

an electronic component unit mounted on said circuit board and coupled electrically to said first node; and a switch mounted on said circuit board and interconnecting said first and second nodes, said switch being operable between a closed state, wherein said programmable device and said electronic component unit receive the input power via said input power port, and an opened state, wherein said programmable device is disconnected from said input power port such that the programming device can be coupled to said second node for supplying input power to said input power terminal when programming said programmable device.

2. The programmable apparatus of claim 1, wherein said switch is a transistor switch connected to said first and second nodes.

3. A method for programming a programmable device mounted on a circuit board and having an input power terminal, the circuit board having a first node, a second node coupled electrically to the input power terminal, a switch for connecting the first and second nodes, and an input power port coupled electrically to the first node for receiving input power, said method comprising the steps of:

allowing the switch to disconnect the connection between the first and second nodes such that the programmable device is disconnected from the input power port when programming the programmable device; and providing a programming device that is coupled to the second node for supplying input power to the input power terminal when programming the programmable device.

* * * * *